United States Patent
Fukuda

(10) Patent No.: US 8,748,084 B2
(45) Date of Patent: Jun. 10, 2014

(54) METHOD FOR PRODUCING OPTICAL ORIENTATION FILM, METHOD FOR PRODUCING RETARDATION FILM, SYSTEM FOR PRODUCING OPTICAL ORIENTATION FILM, OPTICAL ORIENTATION FILM AND RETARDATION FILM

(75) Inventor: Masanori Fukuda, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 189 days.

(21) Appl. No.: 13/173,399

(22) Filed: Jun. 30, 2011

(65) Prior Publication Data
US 2012/0070629 A1 Mar. 22, 2012

(30) Foreign Application Priority Data
Jul. 2, 2010 (JP) ................................ 2010-152167

(51) Int. Cl.
*G03F 7/00* (2006.01)
(52) U.S. Cl.
USPC .......................................... 430/321; 430/320
(58) Field of Classification Search
USPC .............................................. 430/5, 320, 321
See application file for complete search history.

(56) References Cited

U.S. PATENT DOCUMENTS

| 6,567,142 | B1 * | 5/2003 | Kim ............................... 349/119 |
| 7,919,153 | B2 * | 4/2011 | Tomita et al. ................... 428/1.1 |
| 2008/0170189 | A1 * | 7/2008 | Naka et al. ..................... 349/113 |
| 2011/0217638 | A1 * | 9/2011 | Kim et al. ....................... 430/20 |

FOREIGN PATENT DOCUMENTS

JP 2008-299337 A 12/2008

OTHER PUBLICATIONS

M. Nishikawa, et al; "Effect of chemical structures of polyimides on photosensitivity of liquid crystal alignment using polaized UV exposure", Liquid Crystals, 1999, vol. 26, No. 4, pp. 575-580; Available online; Aug. 6, 2010.
Martin Schadt, et al; "Surface-Induced Parallel Alignment of Liquid Crystals by Linearly Polymerized Photopolymers", J. Appl. Phys., vol. 31, Jul. 1992, pp. 2155-2164.

* cited by examiner

*Primary Examiner* — Stewart Fraser
(74) *Attorney, Agent, or Firm* — Ladas & Parry LLP

(57) ABSTRACT

A method for producing an optical orientation film is disclosed, the method being able to realize highly accurate exposure in a pattern, even if a simple device and non-parallel light are used and a long continuous resin substrate is used and fed continuously. The method for producing the optical orientation film includes the steps of: (i) preparing an irradiation target substrate and a long continuous photomask (ii) feeding the irradiation target substrate continuously; (iii) feeding the photomask continuously; (iv) producing a laminate by laminating the photomask fed in step (iii) on an orientation layer of the irradiation target substrate fed in step (ii); (v) exposing the orientation layer in the pattern by irradiating with light, while feeding the laminate obtained in step (iv) in the longitudinal direction of the laminate; and (vi) removing the photomask from the laminate irradiated in step (v).

3 Claims, 10 Drawing Sheets

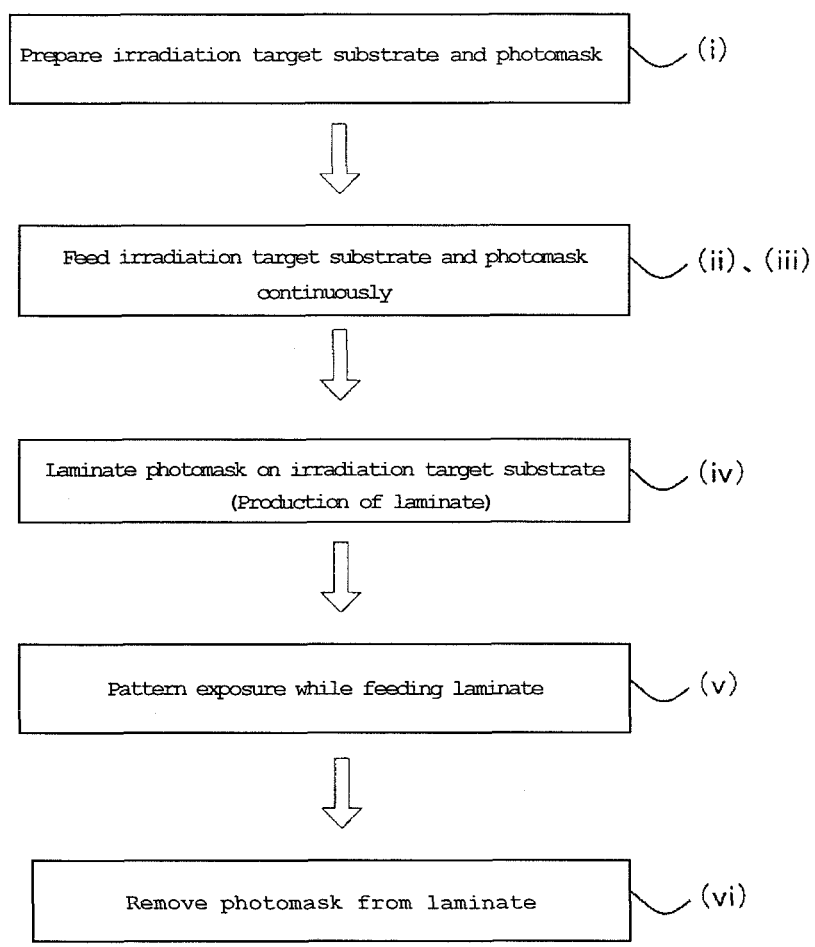

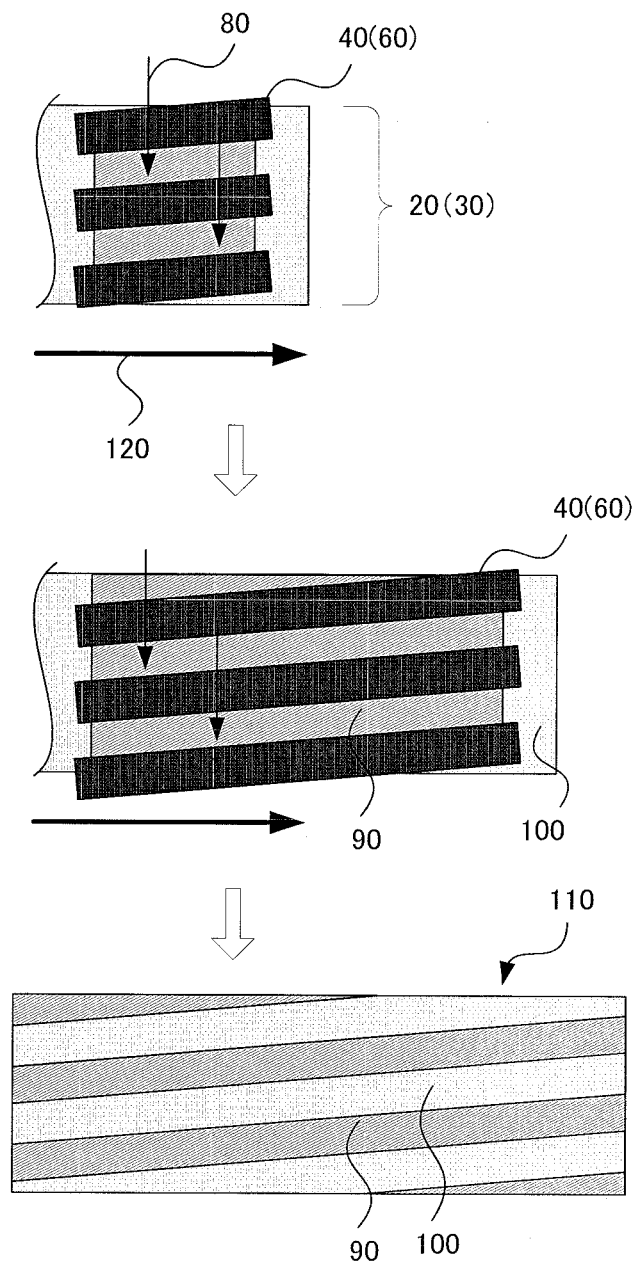

METHOD FOR PRODUCING OPTICAL ORIENTATION FILM, METHOD FOR PRODUCING RETARDATION FILM, SYSTEM FOR PRODUCING OPTICAL ORIENTATION FILM, OPTICAL ORIENTATION FILM AND RETARDATION FILM

TECHNICAL FIELD

The present invention relates to a method for producing an optical orientation film, a method for producing a retardation film, a system for producing an optical orientation film, an optical orientation film obtained by the optical orientation film production method, and a retardation film obtained by the retardation film production method.

BACKGROUND ART

A retardation film used in a liquid crystal display device or the like can be produced by a method such that an orientation layer (orientation film) formed on a substrate is irradiated with polarized ultraviolet light to perform an orientation treatment thereon, thus obtaining an optical orientation film; and liquid crystal is applied onto the orientation layer subjected to the orientation treatment of the optical orientation film and oriented, thus forming a retardation layer.

As such a method of orientation treatment of the orientation layer, there has been reported several methods using a photodimerization reaction, photolysis reaction or photoisomerization reaction, such as a method of controlling the direction of cross-linking formation in a polyvinyl cinnamate orientation layer by irradiation with polarized ultraviolet light (for example, see Non Patent Literature 1) and a method of providing anisotropy to the decomposition of a polyimide orientation layer by irradiation with ultraviolet light (for example, see Non Patent Literature 2).

In recent years, development of techniques for displaying and viewing pictures and images three-dimensionally, is encouraged.

One of the methods for displaying three-dimensional images is a method using polarized glasses (for example, see Patent Literature 1).

An example of the polarized glasses method using a liquid crystal display device is as follows: as shown in FIG. 11, an image (lights) for right eye for 3D viewing is emitted from an even number of lines of panel (display surface) 250 of the liquid crystal display device, while an image (lights) for left eye for 3D viewing is emitted from an odd number of lines. Among the lights for 3D viewing, only the linearly polarized lights which are in the same longitudinal direction as that of polarization axis (transmission axis) 270 of first polarizing plate 260 pass through first polarizing plate 260.

Then, among the linearly polarized lights which passed through the polarizing plate, the light for right eye emitted from the even number of lines of the display surface, which show the image for right eye for 3D viewing, passes through first λ/4 plate 290 in which slow axis 280 is inclined at 45° to polarization axis 270 of first polarizing plate 260. As a result, the light for right eye is converted into circularly-polarized light (elliptically-polarized light) 300. Similarly, among the linearly polarized lights which passed through the plate, the light for left eye emitted from the odd number of lines of display surface, which show the image for left eye for 3D viewing, passes through first λ/4 plate 291 in which slow axis 281 is inclined at −45° to polarization axis 270 of first polarizing plate 260. As a result, the light for left eye is converted into circularly-polarized light (elliptically-polarized light) 301. At this stage, depending on the slope (45° or −45° of the slow axis of each first λ/4 plate, each linearly polarized light is converted into right-handed or left-handed circularly-polarized light (elliptically-polarized light).

Next, second λ/4 plate 320 in which slow axis 310 is perpendicular to slow axis 280 of first λ/4 plate 290, transmits circularly-polarized light (elliptically-polarized light) 300 to convert the light into linearly polarized light in a longitudinal polarization direction. Similarly, circularly-polarized light (elliptically-polarized light) 301 is converted into linearly polarized light in a longitudinal polarization direction through second λ/4 plate 321.

At this stage, depending on the combination of the slope of the slow axis of each second λ/4 plate and the right-handed or left-handed circularly-polarized light (elliptically-polarized light), the circularly-polarized light (elliptically-polarized light) is converted into linearly polarized light in a longitudinal polarization direction or linearly polarized light in a lateral polarization direction. By controlling the slow axes of the first and second λ/4 plates, only the desired light from each of the light for right eye and that for left eye can be converted into a specific polarization direction.

Then, the images for right and left eyes converted into a specific polarization direction (longitudinal direction) through second polarizing plates 261*a* and 261*b* with polarization axis 271 in a longitudinal direction, are separately taken out. The images for right and left eyes are separated through first λ/4 plates 290 and 291, and the separated images for right and left eyes are respectively received by the right glass and left glass of polarization glasses 330, the right glass comprising a combination of second λ/4 plates 320 and second polarizing plates 261 and the left glass comprising second λ/4 plates 321 and second polarizing plates 261, thereby making 3D viewing possible.

In FIG. 11, first λ/4 plates 290 and 291 are schematically and separately shown, in each of which the slope of slow axis 280 or 281 is varied depending on the even or odd lines. In general, however, one λ/4 plate (retardation film) is needed, in which parts with different slow axes at different slopes are disposed in a pattern. As described above, a retardation film is produced by forming a retardation layer on an orientation layer (orientation film); therefore, a λ/4 plate for 3D viewing needs one orientation layer in which parts in different orientation directions are disposed in a pattern.

In the production of the orientation layer (orientation film), when the substrate is a sheet-like substrate such as a glass substrate, as shown in FIG. 12 of Patent Literature 1, a photomask is kept above an orientation film to be shielded from light, having a constant interval (or a proximity gap, hereinafter it may be simply referred to as "gap") therebetween. After an orientation treatment is performed on the orientation film by exposing the film to polarized light radiation through a mask in a pattern, the photomask is removed therefrom. Then, the orientation film is entirely exposed to polarized ultraviolet light in a polarization direction (polarization axis) which is different from that of the pattern exposure. Thereby, an optical orientation film is produced, in which parts in different orientation directions are disposed in a pattern in the orientation layer.

CITATION LIST

[Patent Literature 1] Japanese Patent Application Laid-Open (JP-A) No. 2008-299337
[Non Patent Literature 1] M. Schadt et al.: Jpn. J. Appl. Phys. 31, 2155-2164 (1992)

[Non Patent Literature 2] M. Nishikawa et al.: Liquid Crystals 26, 575-580 (1990)

SUMMARY OF INVENTION

Technical Problem

However, there is a problem that when a gap is provided between a photomask and an orientation layer (orientation film) and the orientation layer is exposed to light as described in Patent Literature 1, high accuracy is required for providing the gap and adjusting alignment on the plane of the layer.

Particularly, the problem of misalignment due to the providing of the gap is more serious since, in the case where the orientation layer is exposed in a pattern through the photomask while a long continuous resin substrate is continuously fed, the long continuous resin substrate is shaken and the gap cannot be kept constant.

As shown in FIG. 12 of Patent Literature 1, in the case where a constant gap is provided and an orientation layer is exposed to light through a photomask, unless all the irradiated light moves parallel and is perpendicular to a surface to be exposed (hereinafter, simply referred to as "parallel light"), the light enters an area which is shielded with the photomask, so that the outline of a pattern is blurred. Therefore, there is a problem that it is not possible to use a longitudinal light source, which has high output but is not able to emit parallel light.

There is also a problem that when the orientation layer is exposed while feeding the long continuous resin substrate continuously and keeping the photomask above the substrate having a constant gap therebetween, the orientation layer can be exposed only in a stripe pattern that is parallel to the feed direction of the resin substrate.

Furthermore, a commonly used photomask is a glass substrate or synthesis quartz substrate on which a light shielding part is formed, so that there is a problem that a photomask having a width that is the same as that of a long continuous resin substrate on which an orientation layer is formed, particularly a photomask having a width of 1,500 mm or more, is expensive and it will be a large-scale, expensive device when combined with a gap-keeping mechanism which keeps a gap constant.

The present invention has been achieved to solve the above problems. A first object of the present invention is to provide a method for producing an optical orientation film, the method being able to easily realize highly accurate exposure in a pattern, regardless of the feed direction, even if a simple, inexpensive device and non-parallel light are used and a long continuous resin substrate is used and fed continuously.

A second object of the present invention is to provide a method for producing a retardation film, using the method for producing the optical orientation film.

A third object of the present invention is to provide an optical orientation film obtained by the method for producing the optical orientation film.

A fourth object of the present invention is to provide a retardation film obtained by the method for producing the retardation film.

A fifth object of the present invention is to provide a system for producing an optical orientation film which can produce the optical orientation film.

Solution to Problem

As a result of diligent researches, the inventor of the present invention has found out that the price of a photomask itself can be reduced by using an inexpensive, flexible transparent resin substrate as the substrate of the photomask, and the photomask can be laminated tightly on the orientation layer due to the flexibility of the transparent resin substrate. Moreover, the inventor of the present invention has found out that no gap is needed by tightly laminating the photomask and the orientation layer, so that it is not necessary to keep the gap constant and it is possible to omit a gap-keeping mechanism. The inventor has also found out that the orientation layer and the photomask are laminated tightly, so that alignment is easy. Furthermore, the inventor of the present invention has found out that because no gap is provided, there is no problem with the outline of a pattern (blurred outline) even though exposed in a pattern to non-parallel light. Moreover, the inventor of the present invention has found out that the photomask is fed along with and in substantially the same position as the orientation layer formed on the long continuous resin substrate, so that the orientation layer can be exposed in any pattern besides a stripe pattern which is parallel to the feed direction of the long continuous resin substrate. Thus, the inventor has reached the present invention.

That is, a method for producing an optical orientation film of the present invention comprises the steps of: (i) preparing an irradiation target substrate and a long continuous photomask, the irradiation target substrate comprising a first long continuous transparent resin substrate and an orientation layer on one surface of the first long continuous transparent resin substrate, and the long continuous photomask comprising a second long continuous transparent resin substrate and a desired ultraviolet shielding pattern on one surface of the second long continuous transparent resin substrate; (ii) feeding the irradiation target substrate continuously; (iii) feeding the photomask continuously; (iv) producing a laminate by laminating the photomask fed in step (iii) on the orientation layer of the irradiation target substrate fed in step (ii); (v) exposing the orientation layer in the pattern by irradiating the orientation layer with first linearly polarized light in a constant polarization direction through the photomask, while feeding the laminate obtained in step (iv) in the longitudinal direction of the laminate; and (vi) removing the photomask from the laminate irradiated with the linearly polarized light in step (v).

A suitable embodiment of the method for producing the optical orientation film of the present invention further comprises step (vii) of forming an optical orientation film in which parts in different orientation directions are disposed in the pattern in the orientation layer on one surface of the first transparent resin substrate, by irradiating the orientation layer exposed in the pattern of the optical orientation film obtained in step (vi) from the orientation layer side with second linearly polarized light in a different polarization direction from that of the first linearly polarized light in step (v). Thereby, it is possible to form the optical orientation film in which parts in different orientation directions are disposed in the pattern in the orientation layer.

A method for producing a retardation film of the present invention further comprises step (viii) of forming a retardation layer on the orientation layer of the optical orientation film after step (vii) of the method for producing the optical orientation film.

A system for producing an optical orientation film of the present invention comprises: a means of continuously feeding an irradiation target substrate comprising a first long continuous transparent resin substrate and an orientation layer on one surface of the first long continuous transparent resin substrate; a means of continuously feeding a long continuous photomask comprising a second long continuous transparent resin substrate and a desired ultraviolet shielding pattern on one surface of the second long continuous transparent resin substrate; a means of producing a laminate by laminating the continuously-fed photomask on the orientation layer of the continuously-fed irradiation target substrate; a means of exposing the orientation layer in the pattern by irradiating the orientation layer of the laminate from the photomask side with first linearly polarized light in a constant polarization direction; and a means of removing the photomask from the laminate irradiated with the linearly polarized light.

A suitable embodiment of the system for producing the optical orientation film of the present invention further comprises a means for irradiating the optical orientation film from the orientation layer side with second linearly polarized light in a different polarization direction from that of the first linearly polarized light, after removing the photomask from the orientation layer. Thereby, it is possible to form the optical orientation film in which parts in different orientation directions are disposed in the pattern in the orientation layer.

The optical orientation film of the present invention can be obtained by the above-described method for producing the optical orientation film.

The retardation film of the present invention can be obtained by the above-described method for producing the retardation film.

Advantageous Effects of Invention

According to the method for producing the optical orientation film of the present invention, it is not necessary to adjust and keep a gap between the photomask and the orientation layer, so that it is possible to produce the optical orientation film with high production efficiency by means of a simple device. Because no gap is provided, a highly accurate pattern with no blurred outline can be formed even though a long continuous transparent resin substrate is used and the orientation layer is exposed to non-parallel light in a pattern. Moreover, the photomask is fed along with and in substantially the same position as the orientation layer formed on the long continuous resin substrate, so that the orientation layer can be exposed in any pattern, besides a stripe pattern which is parallel to the feed direction of the long continuous resin substrate.

According to the system for producing the optical orientation film of the present invention, a means of adjusting and keeping the gap between the photomask and the orientation layer is not necessary, so that it is possible to produce the optical orientation film with high production efficiency by means of a simple device.

BRIEF DESCRIPTION OF DRAWINGS

FIG. 1 is a flowchart showing an example of a flow of a method for producing an optical orientation film of the present invention.

FIG. 4 is a schematic plan view showing an example of a pattern formed on an irradiation target substrate in the case where the irradiation target substrate is exposed while being continuously fed by the method for producing the optical orientation film of the present invention.

REFERENCE SIGNS LIST

Figure 2A:
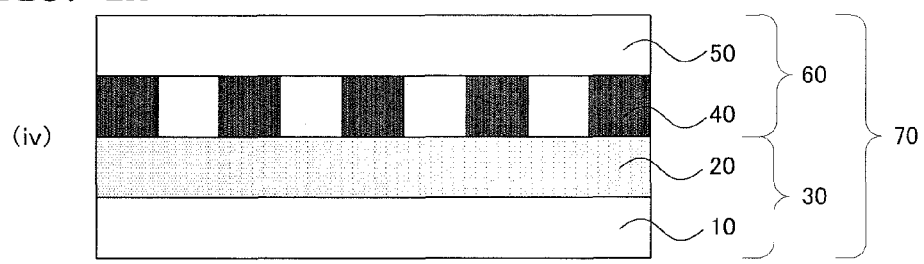
FIGS. 2A to 2C are schematic side views showing an example of the structure of a laminate and optical orientation film in steps (iv) to (vi) of the method for producing the optical orientation film of the present invention.

10: First transparent resin substrate
20: Orientation layer
30: Irradiation target substrate
40: Ultraviolet shielding pattern
50: Second transparent resin substrate
60: Photomask
70: Laminate
80: Linearly polarized light
81: Parallel light
82: Non-parallel light
83: Second linearly polarized light
90 and 91: Exposed part
100: Unexposed part
110 and 111: Optical orientation film
120: Feed direction
130: Conventional orientation film (orientation layer)
140: Gap
150: Retardation layer
151 and 152: Parts in specific orientation direction
160: Retardation film
170 and 171: System for producing optical orientation film
180 and 190: Feed roller
200: Lamination means
210: Removal means
220: Light source
230 and 231: Grid polarizing plate
240 and 241: Transmission axis (polarization direction)
250: Panel
260: First polarizing plate
261: Second polarizing plate
270: Polarization axis (transmission axis)
271: Polarization axis
280 and 281: Slow axis
290 and 291: First $\lambda/4$ plate
300 and 301: Circularly-polarized light (elliptically-polarized light)
310: Slow axis perpendicular to slow axis 280
320 and 321: Second $\lambda/4$ plate
330: Polarized glasses

DESCRIPTION OF EMBODIMENTS

Hereinafter, embodiments of the present invention will be described in detail. However, the present invention is not limited to the following embodiments, and modification and improvement can be achieved within the scope of the purpose of the present invention.

In the present invention, "resin" is a concept that includes polymer besides monomer and oligomer.

In the specification of the present invention, words "plate" and "film" are not differentiated only for the reason that they are different in name.

(Method for Producing Optical Orientation Film)

The method for producing an optical orientation film of the present invention comprises the steps of: (i) preparing an irradiation target substrate and a long continuous photomask, the irradiation target substrate comprising a first long continuous transparent resin substrate and an orientation layer on one surface of the first long continuous transparent resin substrate, and the long continuous photomask comprising a second long continuous transparent resin substrate and a desired ultraviolet shielding pattern on one surface of the second long continuous transparent resin substrate; (ii) feeding the irradiation target substrate continuously; (iii) feeding the photomask continuously; (iv) producing a laminate by laminating the photomask fed in step (iii) on the orientation layer of the irradiation target substrate fed in step (ii); (v) exposing the orientation layer in the pattern by irradiating the orientation layer with first linearly polarized light in a constant polarization direction through the photomask, while feeding the laminate obtained in step (iv) in the longitudinal direction of the laminate; and (vi) removing the photomask from the laminate irradiated with the linearly polarized light in step (v).

Hereinafter, the method for producing the optical orientation film of the present invention will be described with reference to figures.

FIG. 1 is a flowchart showing an example of the flow of the method for producing the optical orientation film of the present invention.

First, an irradiation target substrate and a long continuous photomask are prepared (step (i)), the irradiation target substrate comprising a first long continuous transparent resin substrate and an orientation layer on one surface of the first long continuous transparent resin substrate, and the long continuous photomask comprising a second long continuous transparent resin substrate and a desired ultraviolet shielding pattern on one surface of the second long continuous transparent resin substrate.

Next, the irradiation target substrate and the photomask are fed continuously (steps (ii) and (iii)).

Then, a laminate is produced by laminating the continuously-fed irradiation target substrate and photomask (step (iv)).

Next, while feeding the laminate, the orientation layer is exposed in the pattern by irradiating the orientation layer with first linearly polarized light (ultraviolet light) in a constant polarization direction through the photomask (step (v)).

Next, the photomask is removed from the laminate exposed in the pattern, thereby obtaining an optical orientation film in which parts in a specific orientation direction are disposed in the pattern in the orientation layer (step (vi)).

Figure 2B:
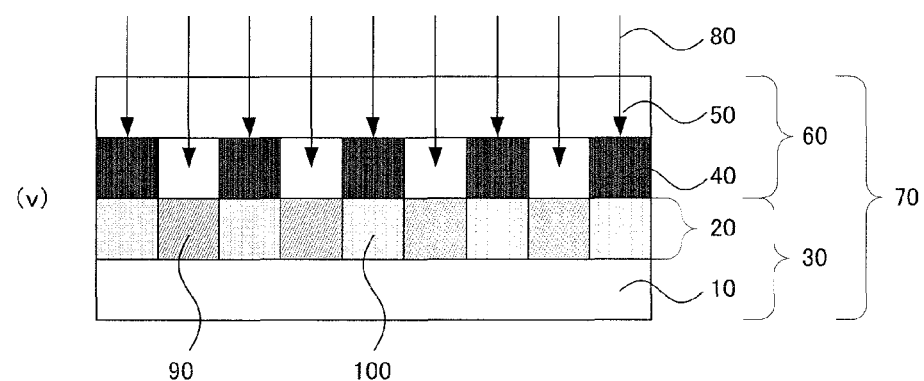
Figure 2C:
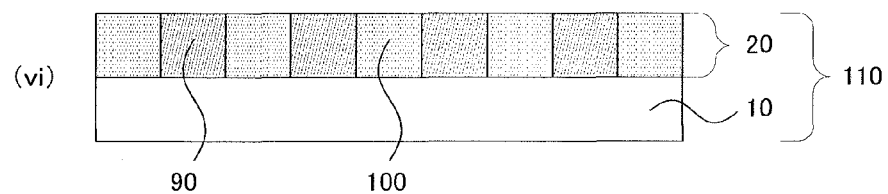

FIGS. 2A to 2C are schematic side views showing an example of the structure of the laminate and optical orientation film in steps (iv) to (vi) of the method for producing the optical orientation film of the present invention. In the schematical views of the present invention, for the sake of convenience, the dimensional ratio between the height and width of each member and the dimensional ratio between the members are each changed and enlarged from the actual dimensional ratio.

Laminate 70 obtained in step (iv) is produced by laminating ultraviolet shielding pattern 40 of photomask 60 on orientation layer 20 of irradiation target substrate 30.

In step (v), orientation layer 20 of laminate 70 obtained in step (iv) is irradiated with first linearly polarized light 80 in a constant polarization direction through photomask 60 to obtain laminate 70 in which exposed parts 90 and unexposed parts 100 are formed in the pattern.

In step (vi), photomask 60 is removed from laminate 70 irradiated with linearly polarized light 80 in step (v), thereby obtaining optical orientation film 110 in which parts (exposed parts) 90 in a specific orientation direction are disposed in the pattern in orientation layer 20.

As described above, ultraviolet shielding pattern 40 of photomask 60 is tightly laminated on orientation layer 20 of irradiation target substrate 30. Therefore, unlike FIG. 12 of Patent Literature 1, it is not necessary to adjust and keep a gap, so that it is possible to produce the optical orientation film with ease and high production efficiency by means of a simple device.

The first and second transparent resin substrates are more inexpensive than a glass substrate or quart substrate, each of which is a general substrate of a photomask. Therefore, it is possible to produce the optical orientation film at low cost.

Also, first transparent resin substrate 10 of irradiation target substrate 30 and second transparent resin substrate 50 of photomask 60 are in a long continuous form and flexible, so that photomask 60 and irradiation target substrate 30 can be easily laminated by means of a conventionally-known device such as a laminator.

Figure 3:
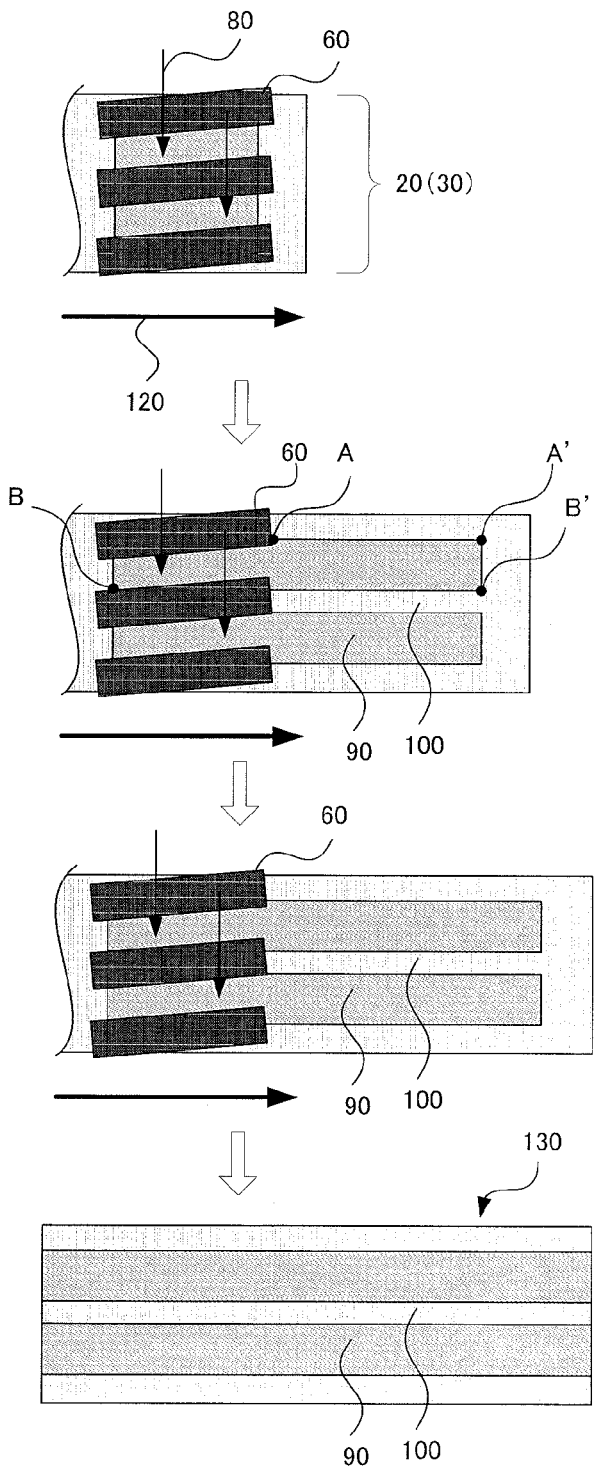
FIG. 3 is a schematic plan view showing an example of a pattern formed on an irradiation target substrate in the conventional case where a photomask is fixed and kept, and the irradiation target substrate is exposed while being continuously fed.

FIG. 3 is a schematic plan view showing an example of a pattern formed on the irradiation target substrate in the conventional case where a gap is provided between the photomask and the orientation layer; the photomask is fixed and kept; and the irradiation target substrate is exposed while being continuously fed.

In an attempt to form a pattern which is parallel to feed direction 120 by providing a gap between the photomask and the orientation layer and aligning photomask 60 parallel to feed direction 120 of irradiation target substrate 30 (orientation layer 20), if an opening of photomask 60 is kept inclined to feed direction 120 of irradiation target substrate 30 as show in FIG. 3, the relative position between photomask 60 and orientation layer 20 is always shifted in a direction which is perpendicular to feed direction 120 by feeding irradiation target substrate 30 (photomask 60 is moved in the width direction of irradiation target substrate 30). Therefore, when orientation layer 20 is irradiated with linearly polarized light 80 through photomask 60 while feeding irradiation target substrate 30, orientation layer 20 between point A and point B in FIG. 3 is exposed and the width of exposed parts 90 is equal to the length between point A' and point B' and is larger than that of the opening of the mask pattern. Only orientation layer 130 is obtained therefore, in which unexposed parts 100 are formed thinner than a light shielding parts (non-opening parts) of the mask pattern, and if the degree of the slope of photomask is large, irradiation target substrate 30 is exposed thoroughly in the width direction thereof. Therefore, in a conventional case where the photomask is fixed and kept and the orientation layer is exposed, a pattern of a predetermined size and in a parallel direction is obtained only when the opening of photomask 60 is kept highly accurately parallel to feed direction 120 (the longitudinal direction of the irradiation target substrate). In addition, pattern accuracy is likely to be poor when the feed rate is high; therefore, it is difficult to increase the production efficiency as well as the feed rate.

To the contrary, as shown in FIG. 4, in the method for producing the optical orientation film of the present invention, photomask 60 and irradiation target substrate 30 are laminated and continuously fed together, so that the relative position between photomask 60 and orientation layer 20 is not shifted by feeding irradiation target substrate 30. Therefore, besides a pattern which is parallel to transported direction 120, it is possible to form a pattern which is perpendicular to feed direction 120 (the longitudinal direction of the irradiation target substrate), a pattern which intersects with the feed direction, or so on, according to the predetermined size of the pattern.

Figure 5A:
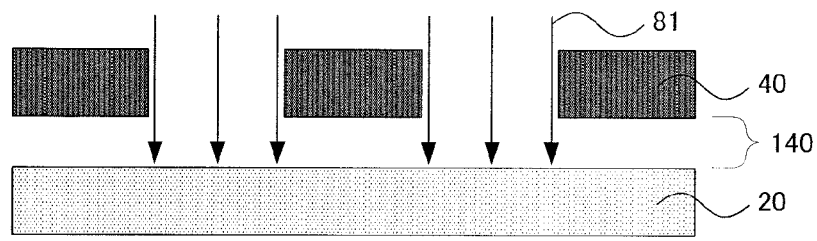
FIGS. 5A, 5C and 5E are side views schematically showing examples of exposure when a gap is provided between the photomask and the orientation layer and the orientation layer is exposed, and when the photomask and the irradiation target substrate are laminated and the orientation layer is exposed.
Figure 5B:
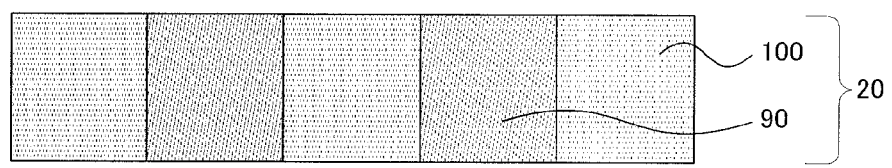
FIGS. 5B, 5D and 5F are plan views schematically showing pattern forms thus obtained in these cases.
Figure 5C:
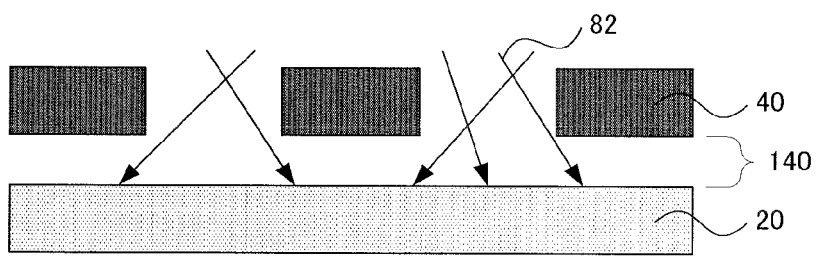
Figure 5D:
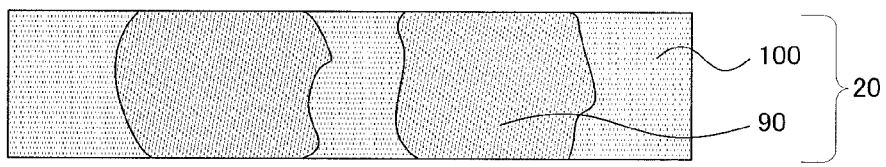
Figure 5E:
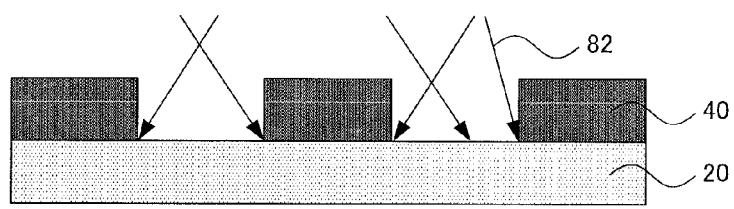
Figure 5F:

FIGS. 5A, 5C and 5E are side views schematically showing examples of exposure when a gap is provided between the photomask and the orientation layer and the orientation layer is exposed, and when the photomask and the irradiation target substrate are laminated and the orientation layer is exposed. FIGS. 5B, 5D and 5F are plan views schematically showing pattern forms thus obtained in these cases.

FIG. 5A is a side view of the case where a gap is between the photomask and the orientation layer and the photomask and the orientation layer are exposed to parallel light without moving the orientation layer. Even if gap 140 is present between orientation layer 20 and ultraviolet shielding pattern 40 of the photomask, as shown in the plan view of FIG. 5B, exposed parts 90 in a highly accurate pattern form can be obtained by using parallel light 81 without moving the irradiation target substrate.

However, as shown in FIG. 5C, in the case of using non-parallel light 82 instead of parallel light 81 of FIG. 5A, parts which are behind light shielding parts (ultraviolet shielding pattern 40) of the photomask and which is not intended to be exposed, is exposed to the light. Therefore, as shown in the plan view of FIG. 5D, exposed parts 90 in a poorly accurate pattern form is obtained.

To the contrary, in the case of the method for producing the optical orientation film of the present invention, as shown in FIG. 5E, orientation layer 20 and ultraviolet shielding pattern 40 of the photomask are tightly laminated, and gap 140 is not present. Thus, even if non-parallel light 82 is used, it does not reach the parts behind the light shielding parts of the photomask, so that only an opening (non-light shielding part) is exposed in the pattern to the light. Therefore, as shown in FIG. 5F, exposed part 90 in a highly accurate pattern form is obtained.

In FIGS. 5A to 5F, for the sake of convenience, the first transparent resin substrate of the irradiation target substrate and the second transparent resin substrate of the photomask are omitted.

As described above, according to the method for producing the optical orientation film of the present invention, because no gap is present between the ultraviolet shielding pattern of the photomask and the orientation layer, it is not necessary to convert non-parallel light into parallel light before irradiation, and it is possible to use high-power non-parallel light, to perform exposure in the pattern easily, to increase the feed rate of the irradiation target substrate (laminate), and to increase production efficiency.

Furthermore, the orientation layer (irradiation target substrate) and the photomask are laminated tightly, so that alignment is also easy.

In step (v) of the method for producing the optical orientation film of the present invention, the ultraviolet light (parallel light or non-parallel light) irradiated in the exposure only has to be linearly polarized light in a specific polarization direction. A point light source or linear (longitudinal) light source which emits ultraviolet light can be used and the light emitted can be converted into linearly polarized light in a desired polarization direction.

As the light source, a conventional light source which emits ultraviolet light can be used. The examples include a discharge lamp such as an ultrahigh pressure mercury lamp or a high pressure mercury lamp, and an electrodeless lamp.

As the polarizer, a conventional polarizing plate using Brewster's angle or a grid polarizing plate can be used.

The polarizing plate using Brewster angle's is a polarizing plate comprising several glass plates which are disposed in parallel at a predetermined interval and inclined at Brewster's angle relative to the incident direction of a main beam. In this case, as the glass plates, it is preferable to use glass plates which have high internal transmittance of ultraviolet light at a wavelength of 310 nm and which are highly effective for optical orientation. It is more preferable to use quartz glass having an internal transmittance of 98% or more.

The grid polarizing plate is a polarizing plate comprising a quartz substrate on which aluminum is disposed in a stripe pattern.

Any of the polarizers can obtain linearly polarized light in a desired polarization direction by rotating the polarizer (polarization axis).

The exposure amount can be appropriately controlled depending on the feed rate of the laminate and a desired orientation direction of the orientation layer. For example, the peak illuminance at a wavelength of 310 nm in the position where the distance between the light source and laminate is the shortest (hereinafter, simply referred to as "substrate feed position") can be 10 to 100 mW/cm$^2$. The irradiation dose to the orientation layer (laminate) can be 10 to 100 mJ/cm$^2$.

The laminate feed rate is 2 to 30 m/min, preferably 5 to 8 m/min.

So far, there has been described the method for producing the optical orientation film in which parts in a specific orientation direction are disposed in a pattern in the orientation layer by irradiating the orientation layer only once in a pattern with linearly polarized light in a specific polarization direction.

To obtain the orientation layer in which parts in different orientation directions are disposed in a pattern, that is, to obtain the optical orientation film which can be suitably used for 3D viewing or the like as described above, the method may further comprise step (vii) of forming an optical orientation film in which parts in different orientation directions are disposed in the pattern in the orientation layer on one surface of the first transparent resin substrate, by irradiating the orientation layer exposed in the pattern of the optical orientation film obtained in step (vi) from the orientation layer side with second linearly polarized light in a different polarization direction from that of the first linearly polarized light in step (v).

Figure 6A:
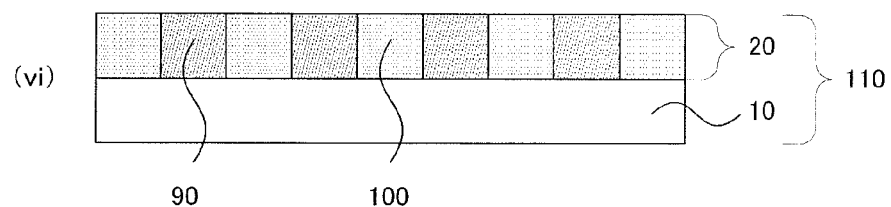
FIGS. 6A and 6B are schematic side views showing examples of the structure of the optical orientation film in step (vii) of the method for producing the optical orientation film of the present invention.
Figure 6B:
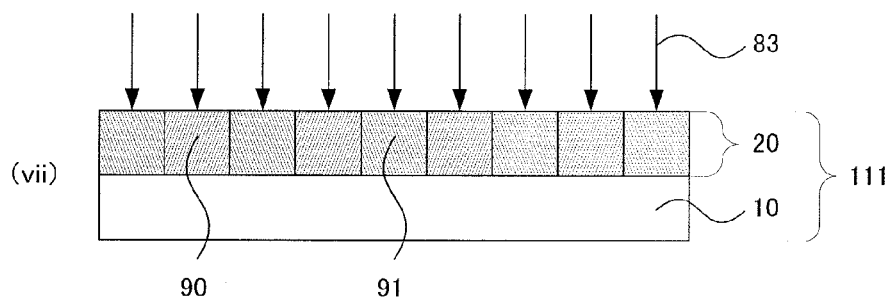

FIGS. 6A and 6B are schematical side views showing examples of the structure of the optical orientation film in step (vii) of the method for producing the optical orientation film of the present invention.

When orientation layer 20 of optical orientation film 110 in FIG. 2C in which the photomask has been removed from the laminate, is irradiated with second linearly polarized light 83 in a different polarization direction from that of the first linearly polarized light in step (v), only unexposed parts 100 which were covered with photomask 60 are subjected to an orientation treatment by second linearly polarized light 83, while maintaining the orientation of exposed parts 90 which were exposed in step (v). Optical orientation film 111 is obtained therefore, comprising orientation layer 20 in which parts (90, 91) in different orientation directions are disposed in the pattern.

As the second linearly polarized light used in step (vii), the linearly polarized light described in connection with the first linearly polarized light can be used. However, the second linearly polarized light can be obtained by using a light source which is the same as or different from that of the first linearly polarized light and by setting the slope of polarization axis of the polarizer relative to the emitted light so as to be different from the slope in step (v).

In the above description, exposed parts 91 are produced by absolutely removing the photomask upon the second polarized exposure and exposing all unexposed parts 100 in step (v) to the second linearly polarized light. However, an optical orientation film comprising an orientation layer in which three or more parts in different orientation directions are disposed in a pattern can be obtained by a method other than the above (not shown in the figures). The method comprises the steps of: removing part of the photomask in a pattern; performing the second polarized light exposure; removing part or all of the remaining photomask further; and performing the subsequent polarized exposure (exposure to the third linearly polarized light in a different polarization direction from those in the first and second exposures).

Hereinafter, there will be described members used in the method for producing the optical orientation film of the present invention, such as irradiation target substrate and photomask, and the optical orientation film obtained by the production method.

(Irradiation Target Substrate)

Irradiation target substrate 30 comprises first transparent resin substrate 10 and orientation layer 20 which has orientation ability and is on one surface of first transparent resin substrate 10. Irradiation target substrate 30 is in a long continuous form derived from first transparent resin substrate 10 and flexible.

(First Transparent Resin Substrate)

First transparent resin substrate 10 at least has to be in a long continuous form and flexible, and those that are used in conventionally-known retardation films or optical films can be used.

In the present invention, "transparent" of the transparent resin substrate means (visible) light transmission of 80% or more.

Examples of the transparent resin substrate include: cellulose based polymers including cellulose acetates such as triacetyl cellulose (TAC) and diacetyl cellulose, and cellulose esters; norbornene based polymers; cycloolefin based polymers; and acrylic based polymers such as polymethlmethacrylate.

A thickness of the transparent resin substrate can be appropriately selected in consideration of the thickness of the optical orientation film or retardation film. For example, preferred is 20 to 500 μm, more preferred is 50 to 200 μm.

To improve adhesion to the optical orientation layer formed on the transparent resin substrate, a surface treatment (e.g., saponification treatment, glow discharge treatment, corona discharge treatment, ultraviolet (UV) treatment, flame treatment) can be preformed thereon, or a primer layer (adhesive layer) can be formed thereon.

Commercially available transparent resin substrates include, for example, norbornene based polymers such as ARTON (product name; manufactured by: JSR Corporation) and Zeonor Film (product name; manufactured by: ZEON Corporation); and cycloolefin based polymers such as S-SINA (product name; manufactured by: Sekisui Chemical Co., Ltd.)

(Orientation Layer)

Orientation layer 20 has orientation ability to orient the orientation of the parts exposed by photoisomerization or photodimerization which is caused by irradiation with linearly polarized light (exposed parts) in a specific direction. When a retardation layer comprising liquid crystal molecules is formed on the orientation layer the orientation layer functions to control the orientation of the liquid crystal molecules. In optical orientation film 110 obtained by the production method of the present invention, parts in at least one specific orientation direction are disposed in a pattern. As described above, when the orientation layer is exposed to two kinds of linearly polarized light in different polarization directions (one exposure for each light), optical orientation film 111 is obtained therefore, comprising orientation layer 20 in which parts (90, 91) in different orientation directions are disposed in a pattern.

The orientation layer can be formed by applying a material for forming the orientation layer onto one surface of the first transparent resin substrate by a conventional method such as roll coating or slot die coating.

The material for forming the orientation layer is not particularly limited as long as it has ultraviolet-sensitive orientation ability, and conventionally-known materials for optical orientation layer can be used.

Examples of the material for forming the orientation layer include: photoisomerizable materials such as compounds having an azobenzene skeleton in a molecule and polymerizable monomers having an azobenzene skeleton as a side chain, as those disclosed in Japanese Patent Application Laid-Open (JP-A) Nos. 2009-230069 and 2006-350322; and photoreactive materials such as reactive polymers containing cinnamate, coumalin or quinolin in a side chain, as those disclosed in JP-A Nos. 2009-230069 and 2006-350322.

A thickness of the orientation layer can be appropriately determined depending on desired properties such as orientation ability, and it is preferably 1 to 1,000 nm, more preferably 3 to 100 nm, from the viewpoint of low cost and sufficient orientation ability.

(Photomask)

Photomask 60 used in the present invention is in a long continuous form corresponding to the form of irradiation target substrate 30. It is flexible, and it is a member comprising second transparent resin substrate 50 and ultraviolet shielding pattern 40 on one surface of second transparent resin substrate 50.

As the photomask, those that are used in conventional photolithography can be used, such as the photomask disclosed in JP-A No. 2005-191180.

(Second Transparent Resin Substrate)

For second transparent resin substrate 50 of the photomask, among the above-mentioned materials for first transparent resin substrate 10, ultraviolet-transparent materials can be especially used. Ultraviolet-transparent materials are materials having a transmittance of 50% or more at a wavelength of 310 nm or more. In particular, a triacetyl cellulose film is preferable, so that the photomask can be laminated tightly on the irradiation target substrate and can be relatively easily removed therefrom. For example, there may be mentioned Z-TAC (product name; manufactured by: FUJIFILM Corporation).

Second transparent resin substrate 50 at least has to (1) allow photomask 60 to be laminated on irradiation target substrate 30 and (2) be able to be exposed in a desired pattern.

The material, light transmittance and size can be the same as or different from those of first transparent resin substrate 10.

(Ultraviolet Shielding Pattern)

Ultraviolet shielding pattern 40 functions to shield the linearly polarized light in step (v) in accordance with the form of the pattern. The ultraviolet shielding pattern can be formed with conventionally-known ink having ultraviolet light absorbing ability.

The light shielding parts of the ultraviolet shielding pattern can be formed from, for example, a composite material obtained by incorporating light shielding particles such as carbon particles, metal oxide or inorganic pigment in an inorganic light-shielding material such as metal chromium, inorganic light absorbing material (e.g., tungsten) or an organic binder, as disclosed in JP-A No. 2005-191180.

The form of the ultraviolet shielding pattern can be appropriately selected depending on the form of a pattern to be formed in the orientation layer.

To make the form of the ultraviolet shielding pattern a stripe form, light shielding parts having a line width of 165 to 330 μm can be provided at intervals of 165 to 330 μm. Because no gap is provided in the method for producing the optical orientation film of the present invention, it is possible to obtain a highly accurate pattern of stripes in orientation directions even though light shielding parts are disposed at intervals of 100 to 150 μm.

It is preferable that the ultraviolet transmittance at a wavelength of 300 to 400 nm of the non-light shielding parts (parts not comprising a light shielding material) of photomask 60 is 50% or more, from the viewpoint of sufficiently orienting the exposed parts of the orientation layer.

It is preferable to further provide a protective layer on the ultraviolet-exposed pattern from the following points of view: the photomask can be prevented from abrasion when it is used repeatedly; moreover, since the photomask is formed with a tacky material, it can be tightly adhered to the irradiation target substrate only by laminating with a laminator, etc., and it can be easily removed therefrom. As the protective film, a coating film with self-curing properties disclosed in U.S. Pat. No. 3,999,411, which does not interfere with exposure to ultraviolet radiation can be used.

(Laminate)

Laminate 70 is produced by laminating photomask 60 to irradiation target substrate 30 in step (iv). To provide no gap between orientation layer 20 and ultraviolet shielding pattern 40, as shown in FIG. 2A, laminate 70 is produced by tightly laminating ultraviolet shielding pattern 40 side of photomask 60 on orientation layer 20 of irradiation target substrate 30. When the protective layer is formed, the protective layer side on the ultraviolet shielding pattern is laminated on the orientation layer.

To laminate ultraviolet shielding pattern 40 on orientation layer 20, for example, ultraviolet shielding pattern 40 is tightly laminated by means of a laminator on a substrate on which orientation layer 20 is formed by coating. In this case, an adhesive or the like is not necessary.

Photomask 60 wound off from the feed roller 190 is laminated on irradiation target substrate 30 by lamination means (laminator roller) 200. In this case, to prevent air from entering between photomask 60 and irradiation target substrate 30, the laminator roller is preferably made of rubber with appropriate hardness and photomask 60 is preferably laminated on irradiation target substrate 30 at an appropriate pressure. After the lamination, as long as photomask 60 is in a state of being kept laminated on irradiation target substrate 30, no removal or slippage occurs therebetween and they can be kept laminated to each other during exposure to polarized ultraviolet radiation. In addition, since no adhesive is used, photomask 60 can be easily removed from irradiation target substrate 30 and wound photomask 60 can be reused.

(Optical Orientation Film)

Optical orientation film 110 comprises first transparent resin substrate 10 and orientation layer 20 on one surface of first transparent resin substrate 10, in which parts in a specific orientation direction are disposed in the pattern.

Optical orientation film 111 comprises first transparent resin substrate 10 and orientation layer 20 on one surface of first transparent resin substrate 10, in which parts in different orientation directions are disposed in the pattern.

In the case of using optical orientation film 111, parts in different orientation directions are disposed in the pattern, so that it is possible to control the orientation of a retardation layer to be in several directions with high accuracy and finely according to the pattern. Therefore, optical orientation film 111 is suitable for producing a retardation film which can realize two or more kinds of optical compensation in the pattern, such as converting linearly polarized light in a specific polarization direction into two or more kinds of elliptically-polarized light in different polarization rotations.

Figure 11:
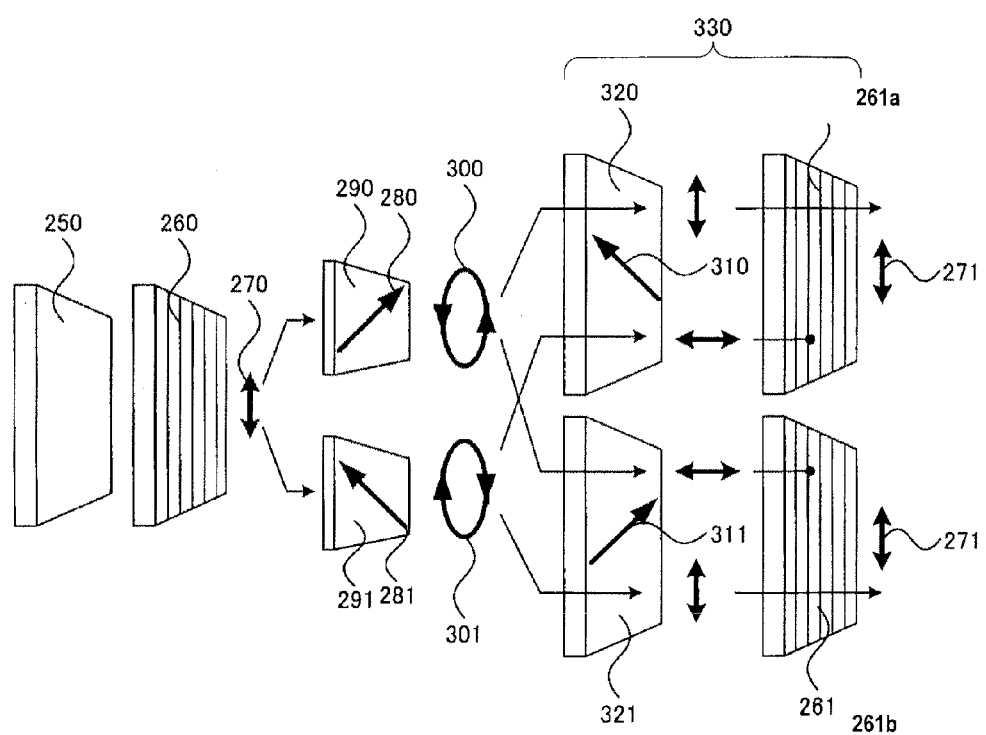
FIG. 11 is a schematic view showing the principle of an example of 3D viewing using a polarized glasses system.

When used for 3D viewing, as shown in FIG. 11, the optical orientation film of the present invention is applicable to a display device in which an image for right eye and that for left eye are emitted from a display surface. Therefore, the optical orientation film of the present invention is also applicable to a display device in which a polarizing plate is laminated on the display surface of an organic EL display or plasma display (that is, a display other than a liquid crystal display device) as long as it is a display device in which an image for right eye and that for left eye are emitted from the display surface using linearly polarized lights.

(Method for Producing Retardation Film)

The method for producing a retardation film of the present invention further comprises, following step (vii) of the method for producing the optical orientation film, step (viii) of forming a retardation layer on the orientation layer of the optical orientation film.

Figure 7:
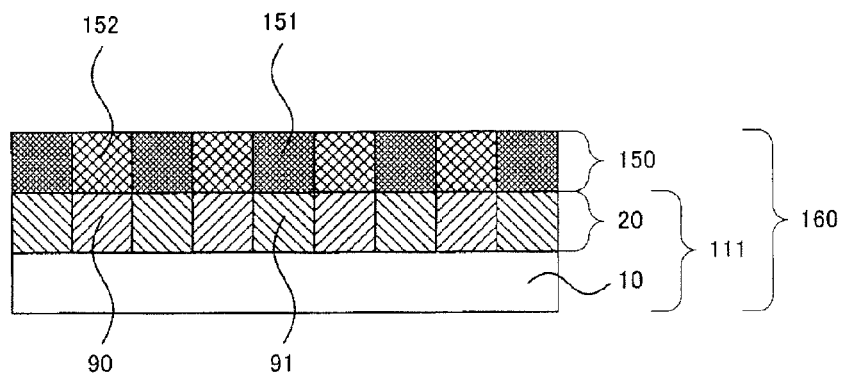
FIG. 7 is a schematic side view showing an example of the structure of a retardation film of the present invention.

FIG. 7 is a schematic side view showing an example of the structure of the retardation film of the present invention. Retardation film 160 can be obtained by, following step (vii) of the method for producing the optical orientation film, further forming retardation layer 150 on orientation layer 20. The orientation of retardation layer 150 is controlled by the orientation of orientation layer 20, so that retardation layer 150 has parts 152 and 151 in different orientation directions corresponding to exposed parts 90 and 91 of orientation layer 20, respectively. As described above, when there are two or more parts in different orientation directions in the orientation layer, parts in different orientation directions are formed in the retardation layer in accordance with them.

Retardation film 160 obtained by the above production method can be suitably used for a λ/4 plate for 3D viewing as described above, because the orientation of orientation layer 20 is controlled to be in several directions finely according to the pattern, so that the orientation of retardation layer 150 can be controlled to be in several directions with high accuracy and finely according to the pattern.

In retardation film 160, retardation layer 150 can be a single layer as shown in FIG. 7, or it can consist of two or more layers stacked (not shown in the figures).

As the material for forming the retardation layer, a conventionally-known material for retardation layer can be used.

An example of such a material is a liquid crystal material which exhibits a nematic liquid crystal phase. As such a liquid crystal material, a conventionally-known liquid crystal material can be used, and the examples include a stick-type liquid crystal molecule, a polymer liquid crystal and a polymerizable liquid crystal compound.

In the case of using the polymerizable liquid crystal compound, it is preferable that the molecule of the polymerizable liquid crystal compound has a polymerizable group at both ends thereof to obtain an optical element having high heat resistance.

Besides the above, the retardation layer can be a retardation layer disclosed in JP-A No. 2009-162874.

(System for Producing Optical Orientation Film)

The system for producing the optical orientation film of the present invention (hereinafter may be referred to as optical orientation film production system) comprises: a means of continuously feeding an irradiation target substrate comprising a first long continuous transparent resin substrate and an orientation layer on one surface of the first long continuous transparent resin substrate; a means of continuously feeding a long continuous photomask comprising a second long continuous transparent resin substrate and a desired ultraviolet shielding pattern on one surface of the second long continuous transparent resin substrate; a means of producing a laminate by laminating the continuously-fed photomask on the orientation layer of the continuously-fed irradiation target substrate; a means of exposing the orientation layer in the pattern by irradiating the orientation layer of the laminate from the photomask side with first linearly polarized light in a constant polarization direction; and a means of removing the photomask from the laminate irradiated with the linearly polarized light.

Figure 8:
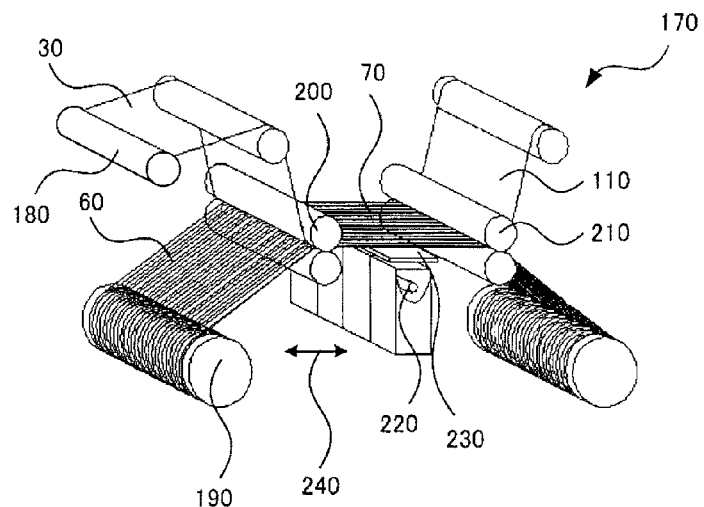
FIG. 8 is a perspective view schematically showing a system for producing the optical orientation film of the present invention.
Figure 9:
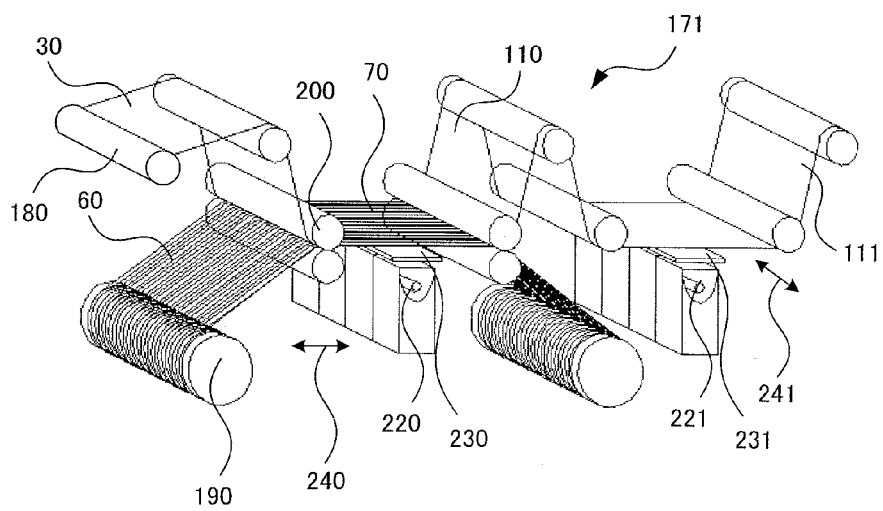
FIG. 9 is a perspective view schematically showing a different system for producing an optical orientation film of the present invention.

FIGS. 8 and 9 are perspective views schematically showing examples of the system for producing the optical orientation film (optical orientation film production system) of the present invention.

FIG. 8 shows an optical orientation film production system, comprising means corresponding to steps (ii) to (vi) of the method for producing the optical orientation film.

Optical orientation film production system 170 in FIG. 8 comprises the following: feed roller 180 which is a means for continuously feeding irradiation target substrate 30; feed roller 190 which is a means for continuously feeding photomask 60; lamination means 200 for laminating photomask 60 on the orientation layer of irradiation target substrate 30 to produce laminate 70; a pattern exposure means; and removal means 210 for removing photomask 60 from laminate 70. The pattern exposure means includes linear light source 220 corresponding to the laminate width and grid polarizing plate 230 which is a polarizer that converts ultraviolet light emitted from light source 220 into linearly polarized light in a specific polarization direction. In FIG. 8, arrow 240 indicates the direction of the transmission axis of grid polarizing plate 230 (polarization direction of linearly polarized light).

FIG. 9 shows a system for producing the optical orientation film, comprising means corresponding to steps (ii) to (vii) of the method for producing the optical orientation film.

Optical orientation film production system 171 in FIG. 9 comprises, in addition to all the means in FIG. 8, a means of irradiating orientation layer 20 from orientation layer 20 side with second linearly polarized light in a different polarization direction from that of the first linearly polarized light, after removing the photomask from the orientation layer. The means for irradiating the orientation layer with the second linearly polarized light includes linear light source 221 corresponding to the laminate width and grid polarizing plate 231 which is a polarizer that converts ultraviolet light emitted from light source 221 into linearly polarized light in a specific polarization direction. In FIG. 9, arrow 241 indicates the direction of the transmission axis of grid polarizing plate 231 (polarization direction of linearly polarized light after the light passes through grid polarizing plate 231). Polarization direction 240 is perpendicular to arrow 241.

Examples of means 180 and 190 for continuously feeding irradiation target substrate 30 or photomask 60 include the feed roller and, for example, a film winding means. As the means, conventionally known means can be used.

An example of the lamination means for producing laminate 70 by laminating photomask 60 and irradiation target substrate 30 is a laminator. As the means, conventionally known means can be used.

An example of the removal means for removing photomask 60 from laminate 70 is an automatic peeler. As the means, conventionally known means can be used.

As irradiation target substrate 30, photomask 60, light sources 220 and 221, and polarizing plates (polarizers) 230 and 231, those described above in connection with the production method can be used. Therefore, the explanation is omitted here.

In FIG. 8, polarization direction 240 of the linearly polarized light is parallel to the feed direction of laminate 70. However, the polarization direction upon pattern exposure is not limited thereto and can be appropriately controlled. In FIG. 9, polarization direction 240 of the first linearly polarized light is perpendicular to polarization direction 241 of the second linearly polarized light. However, the relationship between polarization directions 240 and 241 is not limited thereto as long as the directions are different, and they can be appropriately controlled in accordance with desired properties.

In FIG. 9, the thus-obtained optical orientation film 111 is wound and collected. However, retardation layer 150 (not shown in the figures) can be formed on optical orientation film 111 without wounding the film.

Also in FIG. 9, photomask 60 is removed from laminate 70, and then the second polarized light exposure is performed on orientation layer 20 of optical orientation film 110 in-line (on a single production line). However, the present invention is not limited thereto. The second polarized light exposure can be performed by winding optical orientation film 110 and feeding optical orientation film 110 off-line (on a different production line).

The present invention is not limited to the above embodiments. The above embodiments are examples, and any embodiment which has a constitution substantially the same as the technical ideas disclosed in claims of the present invention and exerts similar effects and advantages is included in the technical scope of the present invention.

EXAMPLES

Hereinafter, the present invention will be described further in detail with reference to examples. The scope of the present invention is not limited to the following examples.

(Preparation of Irradiation Target Substrate)

A long continuous triacetyl cellulose film (product name: FUJITAC; manufactured by: FUJIFILM Corporation) having a width of 1,500 mm was prepared as a first transparent resin substrate, and on the first transparent resin substrate, an orientation layer produced by the method disclosed in JP Patent No. 4,205,195, that is, an orientation layer having a width of 1,450 mm and a thickness of 0.05 μm was formed by applying a propanol solution of (E)-3,4-dimethoxycinnamic acid-6-(3-triethoxysilanylpropylcarbamoyloxy)hexyl ester and drying the same, thereby obtaining an irradiation target substrate.

(Preparation of Photomask)

Figure 10:
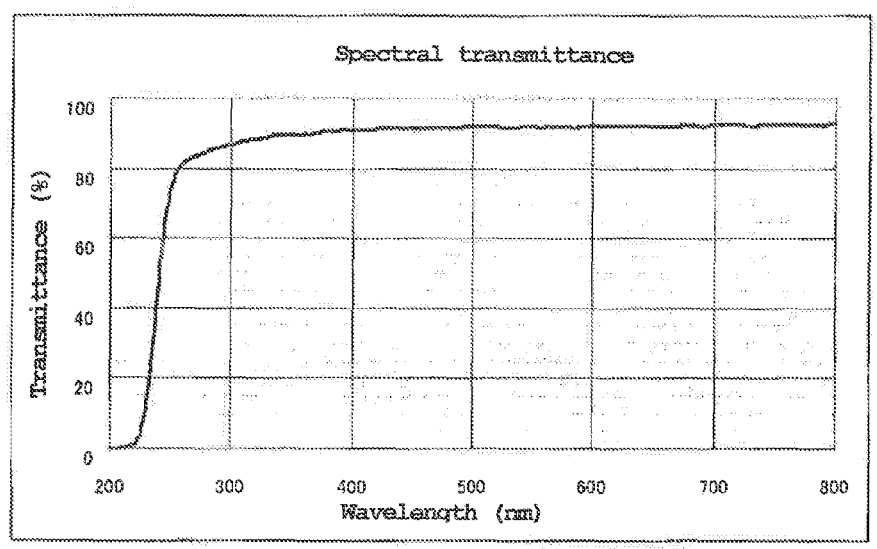
FIG. 10 is a graph showing a spectral transmission of a photomask used in Example.

A long continuous triacetyl cellulose film (product name: Z-TAC; manufactured by: FUJIFILM Corporation) having a width of 1,500 mm was prepared as a second transparent resin substrate, and an ultraviolet shielding pattern was formed on the second transparent resin substrate with a light shielding material comprising a resist for black matrix for color filter, the pattern being parallel to the longitudinal direction of the second transparent resin substrate and comprising light shielding parts having a line width of 270 μm at intervals of 270 μm, thereby obtaining a photomask. At this stage, non-light shielding parts of the photomask had a transmittance of 80% or more at a wavelength of 300 to 400 nm. FIG. 10 is a graph showing the spectral transmission of the non-light shielding parts of the photomask at a wavelength of 200 to 800 nm.

Example 1

In the system shown in FIG. 9, irradiation target substrate 30 wound around feed roller 180 and photomask 60 wound around feed roller 190 were wound off, and ultraviolet shielding pattern 40 was laminated on orientation layer 20 by lamination means (laminator roller) 200. An electrodeless lamp (manufacture by: Fusion UV Systems Japan K.K.; H bulb) was used as light source 220. Ultraviolet light emitted from light source 220 was converted into linearly polarized light in polarization direction 240 which is parallel to the feed direction of laminate 70 using a grid polarizing plate (product name: ProFlux; manufactured by: Polatechno Co., Ltd.), and orientation layer 20 was irradiated with the linearly polarized light through photomask 60 in the pattern. At this stage, the feed rate of laminate 70 was set to 8 m/min, the peak illuminance at a wavelength of 310 nm in the substrate feed position was set to 44 mW/cm$^2$, and the irradiation dose was set to 10 mJ/cm$^2$.

Next, photomask 60 was removed from laminate 70 exposed in the pattern. As shown in FIG. 9, ultraviolet light emitted from second light source 221 (an electrodeless lamp manufacture by: Fusion CV Systems Japan K.K.; H bulb) was converted in-line into linearly polarized light in polarization direction 241 which is perpendicular to the feed direction of the optical orientation film using a grid polarizing plate (product name: ProFlux; manufactured by: Polatechno Co., Ltd.) having a transmission axis which is perpendicular to the feed direction of the optical orientation film. Orientation layer 20 was irradiated with the linearly polarized light to expose unexposed parts 100, thereby obtaining optical orientation film 111. In the second exposure, the feed rate of optical orientation film 110 was set to 8 m/min, the peak illuminance at a wavelength of 310 nm in the substrate feed position was set to 22 mW/cm$^2$, and the irradiation dose was set to 5 mJ/cm$^2$. Nematic liquid crystal was applied onto orientation layer 20 of the thus-obtained optical orientation film 111 to form retardation layer 150 having a film thickness of 1 μm, thereby obtaining retardation film 160.

A λ/4 plate and a sample of the thus-obtained retardation film 160 were laminated so that the slow axis of the sample film was perpendicular to the λ/4 plate, and the resulting laminate was observed by means of a polarizing microscope. As a result, it was found that the orientations of the photomask followed the ultraviolet shielding pattern.

Comparative Example 1

A retardation film was obtained similarly as in Example 1 except that the first pattern exposure was performed not by laminating photomask 60 on irradiation target substrate 30 but by providing a 150 μm gap between photomask 60 and orientation layer 20.

As with Example 1, a λ/4 plate and a sample of the thus-obtained retardation film were laminated so that the slow axis of the sample film was perpendicular to the λ/4 plate, and the resulting laminate was observed by means of a polarizing microscope. As a result, it was found that the orientation axis of the thus-obtained film was parallel to that of the first polarized light exposure all over the surface.

(Result)

Because no gap was present between the photomask and orientation layer, the retardation film of Example 1 produced by the production method and system of the present invention could form a highly accurate pattern with no blurred outline even when the orientation layer was irradiated with linearly polarized light through the photomask while feeding the irradiation target substrate.

In Comparative example 1, there was a gap between the photomask and orientation layer. When the orientation layer was irradiated with linearly polarized light through the photomask while feeding the irradiation target substrate, the photomask was kept inclined to the feed direction, so that the relative position between the photomask and the orientation layer was shifted, and the orientation layer was exposed in a larger width than that of an opening of the mask pattern and thus in all over the width direction of the irradiation target substrate.

The invention claimed is:

1. A method for producing an optical orientation film, comprising the steps of:
   (i) preparing an irradiation target substrate and a continuous photomask, the irradiation target substrate comprising a first continuous transparent-resin substrate and an orientation layer on one surface of the first continuous transparent resin substrate, and the continuous photomask comprising a second continuous transparent resin substrate and a desired ultraviolet shielding pattern on one surface of the second continuous transparent resin substrate;
   (ii) feeding the irradiation target substrate continuously;
   (iii) feeding the photomask continuously;
   (iv) producing a laminate by laminating the photomask fed in step (iii) on the orientation layer of the irradiation target substrate fed in step (ii);
   (v) exposing the orientation layer in the pattern by irradiating the orientation layer with first linearly polarized light in a constant polarization direction through the photomask, while feeding the laminate obtained in step (iv) in the longitudinal direction of the laminate; and (vi) removing the photomask from the laminate irradiated with the linearly polarized light in step (v).

2. The method for producing the optical orientation film according to claim 1, further comprising step (vii) of forming an optical orientation film in which parts in different orientation directions are disposed in the pattern in the orientation layer on one surface of the first transparent resin substrate, by irradiating the orientation layer exposed in the pattern of the optical orientation film obtained in step (vi) from the orientation layer side with second linearly polarized light in a different polarization direction from that of the first linearly polarized light in step (v).

3. A method for producing a retardation film, comprising the steps of: (i) preparing an irradiation target substrate and a continuous photomask, the irradiation target substrate comprising a first continuous transparent resin substrate and an orientation layer on one surface of the first continuous transparent resin substrate, and the continuous photomask comprising a second continuous transparent resin substrate and a desired ultraviolet shielding pattern on one surface of the second continuous transparent resin substrate; (ii) feeding the irradiation target substrate continuously; (iii) feeding the photomask continuously; (iv) producing a laminate by laminating the photomask fed in step (iii) on the orientation layer of the irradiation target substrate fed in step (ii); (v) exposing the orientation layer in the pattern by irradiating the orientation layer with first linearly polarized light in a constant polarization direction through the photomask, while feeding the laminate obtained in step (iv) in the longitudinal direction of the laminate; (vi) removing the photomask from the laminate irradiated with the linearly polarized light in step (v); (vii) forming an optical orientation film in which parts in different orientation directions are disposed in the pattern in the orientation layer on one surface of the first transparent resin substrate by irradiating the orientation layer exposed in the pattern of the optical orientation film obtained in step (vi) from the orientation layer side with second linearly polarized light in a different polarization direction from that of the first linearly polarized light in step (v); and (viii) forming a retardation layer on the orientation layer of the optical orientation film.

\* \* \* \* \*